United States Patent
Stans et al.

[11] Patent Number: 5,593,499
[45] Date of Patent: Jan. 14, 1997

[54] DUAL AIR KNIFE FOR HOT AIR SOLDER LEVELLING

[75] Inventors: Louis J. Stans, Setauket; James Tullo, Lindenhurst; Thomas S. Kohm, Huntington, all of N.Y.

[73] Assignee: Photocircuits Corporation, Glen Cove, N.Y.

[21] Appl. No.: 366,984

[22] Filed: Dec. 30, 1994

[51] Int. Cl.$^6$ .................................................. H05K 3/24
[52] U.S. Cl. ............................ 118/63; 427/96; 427/349
[58] Field of Search ........................... 228/20.1; 118/63; 427/96, 349

[56] References Cited

U.S. PATENT DOCUMENTS

| | | | |
|---|---|---|---|
| 3,435,801 | 4/1969 | Carini et al. | 118/63 |
| 3,865,298 | 2/1975 | Allen et al. | 228/20.1 X |
| 4,502,408 | 3/1985 | Hennechart et al. | 118/63 X |
| 5,254,166 | 10/1993 | Tu | 118/63 |

*Primary Examiner*—Kenneth J. Ramsey
*Attorney, Agent, or Firm*—Nixon, Hargrave, Devans & Doyle

[57] ABSTRACT

A dual air knife assembly for removing excess solder and leveling any remaining solder on a passing circuit board with a gas from a gas source in accordance with the present invention includes a first and second air knife. The first air knife has a first passage with a first inlet adapted to connect to the gas source and a first outlet adapted to be positioned adjacent the passing circuit board. The second air knife has a second passage with a second inlet connected to the gas source and a second outlet adapted to be positioned adjacent the passing circuit board. The first air knife is adapted to be positioned substantially perpendicular to the circuit board and the second air knife is adapted to be positioned at an angle less than 90 degrees and preferably between 20 and 60 degrees to the circuit board. The dual air knife assembly may include a spacer which separates the a first and second air knife and is recessed from the outlets of the a first and second air knife to create an expansion chamber. The distance the first and second outlets are from the passing circuit board and the temperature and pressure of the gas exiting from the a first and second air knife should all be substantially the same. Typically, the dual air knife assembly is used in a soldering system which includes a conveyor, a flux station, and a solder station. The dual air knife assembly is used in a process referred to as "hot air solder levelling" to remove excess solder and more evenly distribute any remaining solder. A pair of dual air knife assemblies may be used in another soldering system where excess solder is removed and any remaining solder is levelled on both sides of a circuit board.

31 Claims, 3 Drawing Sheets

DUAL AIR KNIFE FOR HOT AIR SOLDER LEVELLING

FIELD OF THE INVENTION

This invention relates generally to an apparatus for controlling the application of solder to a circuit board and more particularly, to an apparatus with a dual air knife for removing excess solder and levelling any remaining solder on a circuit board.

BACKGROUND OF THE INVENTION

To prepare pads and holes on a circuit board to subsequently be solder bonded to components placed on the circuit board a number of processes must be performed on the circuit board. Each circuit board needs to be etched, brushed, rinsed and dried. A coating of flux is applied and then heated to enable the flux to flow and chemically prepare the pads and holes to receive molten solder. Once the circuit board is prepared with flux, solder is applied to the pads and holes on the circuit board. Next, the excess molten solder is removed by blowing it off the circuit board and out of holes on the board and the remaining solder on the board is levelled. Levelling solder has traditionally been carried out with a single hot air knife, as shown in U.S. Pat. No. 4,600,137 to Comerford and U.S. Pat. No. 4,410,126 to O'Rourke which are incorporated herein by reference. The circuit board is then cooled down, the solder flux is removed, and the circuit board is physically scrubbed, rinsed and dried to remove any contaminants.

Although the solder removal and levelling process described above does remove some excess solder and helps distribute the solder more evenly, serious solder defects still occur. In particular, the failure of the above-described process to remove excess solder and level the of solder has resulted in undesired solder bridging between pads and in inconsistent distribution of solder thickness producing "starved" solder regions and "frozen solder waves."

One such frozen solder wave 10 which is known in the prior art is shown in FIGS. 1(*a*)–(*b*). The solder wave 10 extends up from the solder 12 deposited on the copper pads 14 on the circuit board 16. The frozen solder wave 10 is also referred to as "the double hung window effect" because of its appearance as shown from the top view in FIG. 1(*b*) and is caused by improper levelling of the pads surrounding holes. Ideally, the solder thickness or height around the holes would be the same as at other locations for the pads on the circuit board 16. The inadequate distribution of the solder which results in the starved regions and frozen solder waves is problematic because it impedes precise placement of surface mount components and may cause solderability problems.

SUMMARY OF THE INVENTION

A dual air knife assembly for removing excess solder and leveling any remaining solder on a passing circuit board with a gas from a gas source in accordance with the present invention includes a first and second air knife. The first air knife has a first passage with a first inlet adapted to connect to the gas source and a first outlet adapted to be positioned adjacent to one side of the passing circuit board. The second air knife has a second passage with a second inlet connected to the gas source and a second outlet adapted to be positioned adjacent the same side of the passing circuit board as the first air knife. The first air knife is adapted to be positioned substantially perpendicular to the circuit board and the second air knife is adapted to be positioned at an angle between 20 and 60 degrees to the circuit board. The dual air knife assembly may include a spacer which separates the a first and second air knife and is recessed from the outlets of the a first and second air knife to create an expansion chamber. The distance the first and second outlets are from the passing circuit board and the temperature and pressure of the gas exiting from the first and second outlets should all be substantially the same.

Typically, the dual air knife assembly is used in a soldering system which includes a conveyor, a flux station, and a solder station. The dual air knife assembly is used in a process referred to as "hot air solder levelling" also known as HASL, to remove excess solder and more evenly distribute any remaining solder. A second dual air knife assembly may be used in another soldering system where excess solder is removed and any remaining solder is levelled on both sides of a circuit board. Generally, the dual air knife assembly is positioned to level solder on the component side of the circuit board.

With the present invention, a process known as hot air solder levelling is improved because excess solder is more completely removed and any remaining solder is more evenly distributed. The dual air knife assembly enables very low deviations in solder thickness to be achieved and virtually eliminates the generation of frozen solder waves. The dual air knife assembly in accordance with the present invention is particularly useful in high volume circuit board fabrication, because the throughput of circuit boards without serious solder defects is increased.

BRIEF DESCRIPTION OF THE DRAWINGS

FIG. 1(*b*) is a top view of the circuit board with the solder wave shown in FIG. 1(*a*) to illustrate the "double hung window effect;"

DETAILED DESCRIPTION OF THE INVENTION

Figure 2:
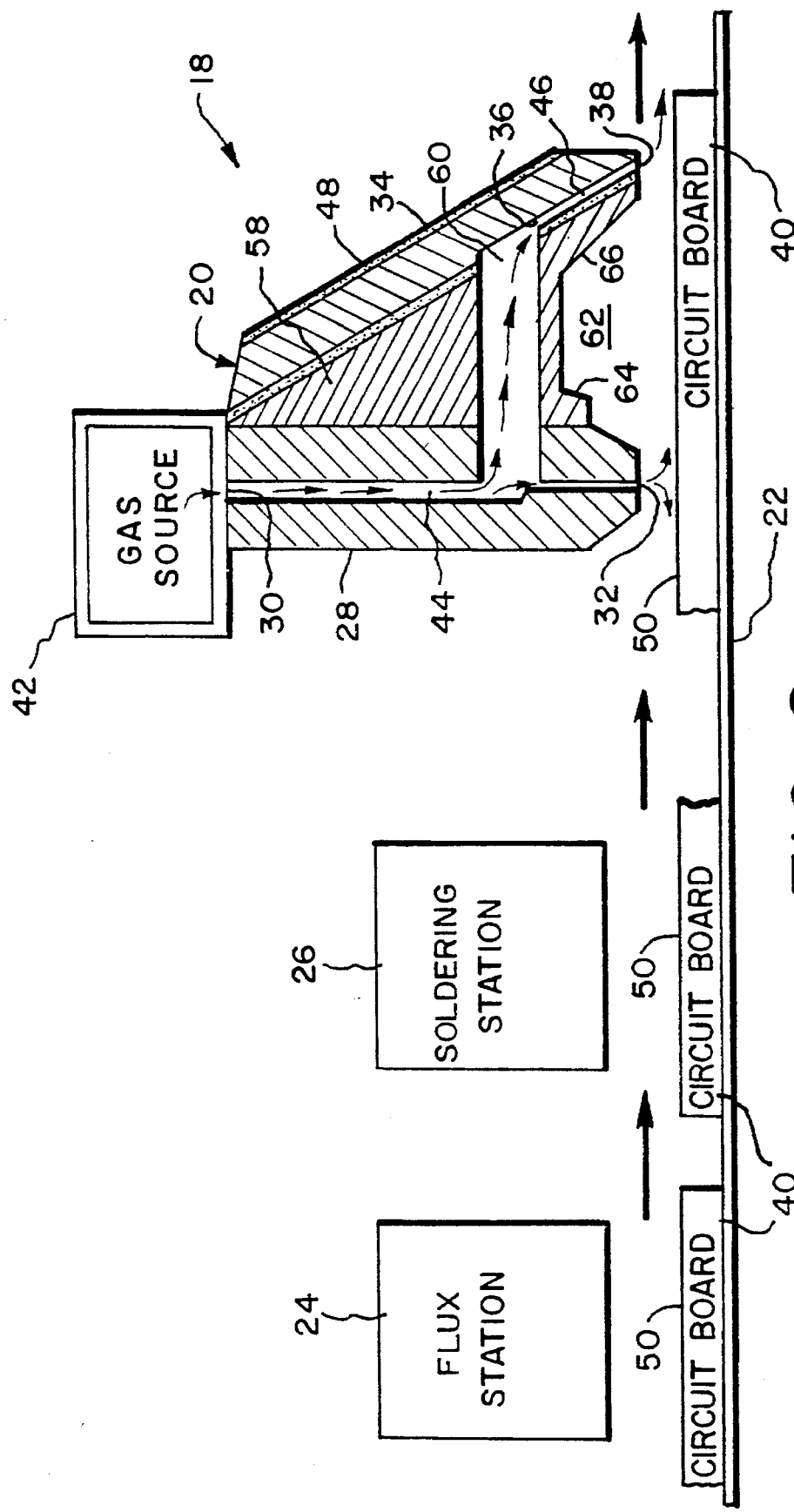
FIG. 2 is a side, cross-sectional view of a hot air solder levelling system with a dual air knife assembly in accordance with the present invention.

A solder system 18 with a dual air knife assembly 20 in accordance with the present invention is illustrated in FIG. 2. The soldering system 18 includes a conveyer 22, a flux station 24, a soldering station 26, and the dual air knife 20. The dual air knife assembly 20 includes a first air knife 28 with a first inlet 30 and outlet 32 and a second air knife 34 with a second inlet 36 and outlet 38. First and second air knives 28 and 34 are each adapted to have their first and second outlets 32 and 38 positioned adjacent to any passing circuit board 40 on conveyor 22 and to have their first and second inlets 30 and 36 connected to a gas source 42.

Referring more specifically to FIG. 2, solder system 18 in accordance with the present invention is shown. Solder system 18 includes conveyor 22 which moves any circuit boards 40 past flux station 24, soldering station 26, and dual air knife assembly 20 in the direction of the arrows. Preferably, conveyor 22 operates at a speed of 31 feet per minute, however the speed can be adjusted as desired or need. The velocity of conveyor 22 should remain constant to optimize the removal of excess solder and the levelling of any remaining solder.

Flux station 24 applies flux, such as rosin or any other type of flux desired, to any circuit boards 40 passing on conveyor 22. In this particular embodiment, the flux is applied by passing board 40 through a wave of flux, although other techniques for applying flux, such as by spraying or brushing on the flux, can be used. The flux protects the metal surfaces on circuit board 40 from oxidation while being heated, dissolves any oxides on the metal surfaces, and lowers the surface tension of the applied solder so it flows freely.

Soldering station 26 applies solder to each circuit board 40 passing on conveyor 22. In this particular embodiment, a wave soldering process is used to apply the solder, although other techniques, such as dip, cascade and jet, drag, or pot soldering could be used. Any type of solder can be used, although the viscosity, temperature and metallic alloy formation of the solder used will effect the amount of solder removed and the consistency of any solder levelling by a hot air levelling process using dual air knife assembly 20.

Dual air knife assembly 20 includes first air knife 28 which has a first passage 44 which extends from first inlet 30 to first outlet 32 and second air knife 34 has a second passage 46 which extends from second inlet 36 to second outlet 38. First inlet 30 is coupled to gas source 42 and first outlet 32 is positioned to be adjacent to one side of any circuit board 40 which may pass by on conveyor 22. Similarly, second outlet 38 is positioned adjacent to the same side of any circuit board 40 which may pass by on conveyor 22. Outlets 32 and 38 are openings in a plate which is parallel to the direction of the circuit board pathway. In this particular embodiment, outlets 32 and 38 are rectangular in shape and extend across the width of the circuit board pathway. Dual air knife 20 with first and second air knife 28 and 34 can be made from a variety of materials, such as tool steel. A layer of insulating material 48, such as a 0.25 inch layer of Fiberfac composite insulation, may be placed around second air knife 34 to decrease thermal and conductive heat losses. Although only first and second air knife 28 and 34 are shown, dual air knife assembly 20 could be constructed to have additional air knives, if desired. The internal pans of dual air knife assembly 20 exposed to hot air may be plated with nickel to prevent metallic oxidation of the internal parts to produce scaling which will eventually be cut within passages 44 and 46 producing a turbulence and laminar air flows across the boards to be soldered.

By adjusting and controlling a number of factors related to dual air knife assembly 20 the removal of excess solder and the leveling of any remaining solder can be optimized. These factors include the distance of first and second outlets 32 and 38 from top surface 30 of a passing circuit board 40, the angle of first and second air knife 28 and 34 with respect to passing circuit boards 40, the spacing between first and second outlets 32 and 38, the temperature of the gas exiting from first and second outlets 32 and 38, the pressure of the gas exiting from first and second outlets 32 and 38, the consistency of the pressure and flow from first and second outlets 32 and 38, the size of first and second outlets 32 and 38 and the flow configuration through first and second air knife 28 and 34. Each of the factors related to dual air knife 20 is addressed below.

Figure 3:
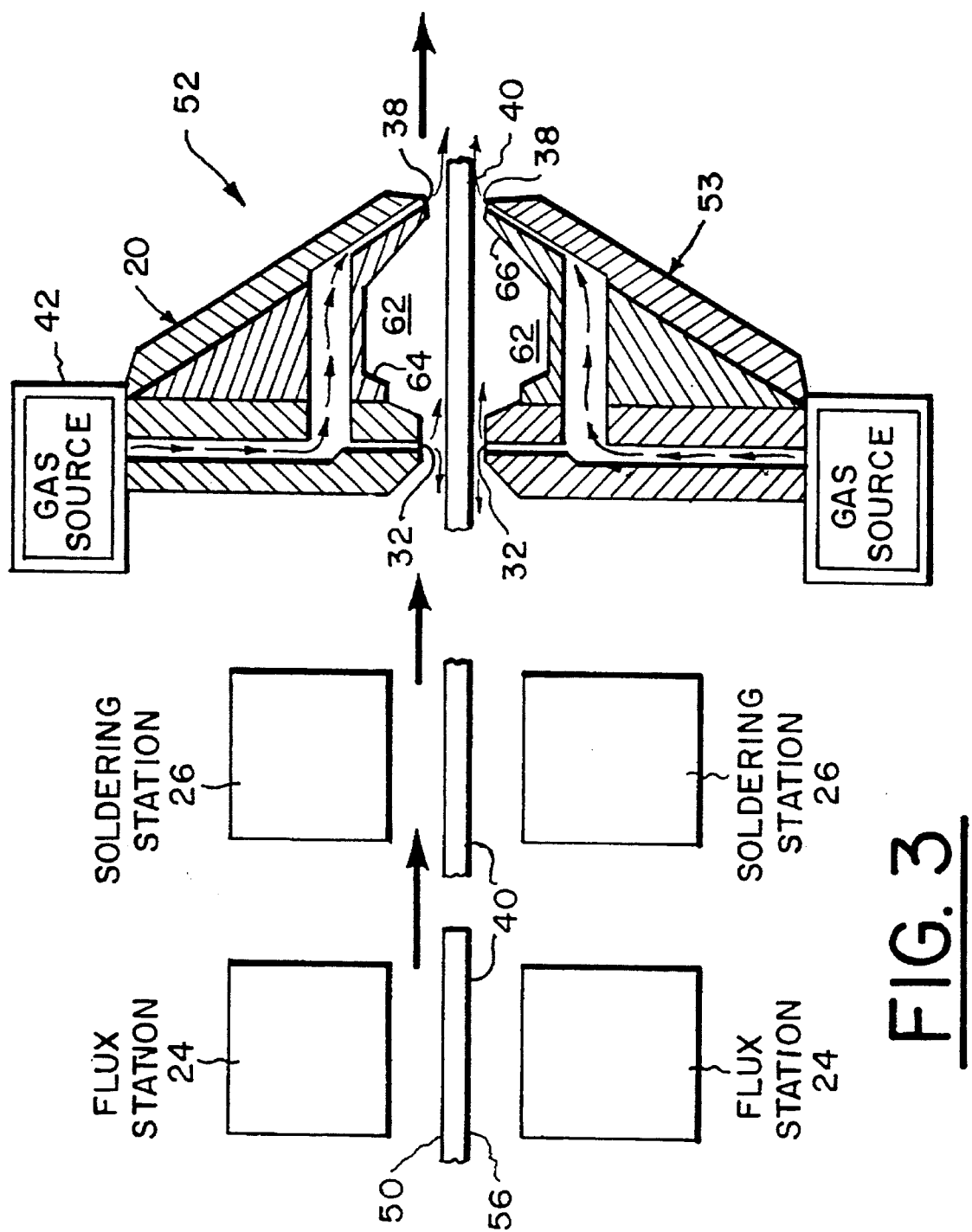
FIG. 3 is a side, cross-sectional view of another hot air solder levelling system with a pair of dual air knife assemblies in accordance with the present invention.

The distance first and second outlets 32 and 38 are positioned from any circuit board 40 which may pass by on conveyor 22 should be substantially the same. Preferably, first and second outlets 32 and 38 are positioned about 40–70 mils above the top surface 30 of any passing circuit boards 40, with an optimum distance being about 50 mils. If a solder system 52 has a second dual air knife 54 for soldering bottom surface 56 of circuit board 40, as shown in FIG. 3, then first and second outlets 32 and 38 of second dual air knife 54 are about 35 mils +/- 5 mils below bottom surface 56 of any passing circuit board 40. First air knife 28 is positioned to be substantially perpendicular to conveyor 22 and second air knife 34 is positioned at an angle less than 90 degrees and preferably between 20 to 60 degrees to conveyor 22, with an angle of 40 degrees being optimal.

The spacing between first and second outlets 32 and 38 is tuned to maximize the levelling effect of dual air knife assembly 20 on the solder. The spacing for the maximum levelling effect is determined by the speed of conveyor 22. In this particular embodiment, first and second outlets 32 and 38 are separated between 0.5 inches to 2.5 inches apart, with a 1.0 inch separation yielding optimal results.

The temperature of the gas exiting from first and second outlets 32 and 38 is substantially the same and is high enough to keep the solder in a liquid state. In this particular embodiment, the temperature is between 400 degrees fahrenheit and 450 degrees fahrenheit, with an optimum setting at 430 degrees fahrenheit. Because of thermal and conductive heat losses the air exiting from second outlet 38 would be expected to be about 20–30 degrees lower than from first outlet 32, but as noted earlier second air knife 34 is covered with an insulating layer 48 to prevent thermal and conductive heat losses keeping both temperatures substantially the same.

The pressure or flow of gas exiting from first and second outlets 32 and 38 is substantially the same. In this particular embodiment, the pressure measured in the parallel regions of the dual air knife assembly 20 at 0.375 inches before the hot air exits first and second outlets 32 and 38 is between 2.0 psi and 3.5 psi, with an optimum setting at 2.9 psi. The pressure of the gas from first and second outlets 32 and 38 should also remain constant to optimize removal of excess solder and levelling of any remaining solder. The gas for first and second air knife 28 and 34 is provided by gas source 42. In this particular embodiment, gas source 42 provides hot air, although other types of gas could be used.

First and second outlets 32 and 38 have substantially the same size air gap or width to optimize removal of excess solder and levelling of any remaining solder. Preferably, first and second outlets 32 and 38 have a gap between 20 and 30 mils. First and second passages 44 and 46 are configured to become more narrow as they approach first and second outlets 32 and 38 to increase the pressure of the exiting hot air to about 2.9 psi. As a result of this flow configuration, the exiting pressure of the hot air from first and second outlets 32 and 38 can be maintained and controlled.

A spacer 58 is positioned between first and second air knives 28 and 34 and has a port 60 which connects second inlet 36 to first passage 44. Spacer 58 is be made from a material which has excellent heat transfer properties and is resistent to abrasion, such as beryllium copper, although other materials such as steel, aluminum, or a copper alloy could be used. Spacer 58 is recessed from conveyor 22 and first and second outlets 32 and 38 to create an expansion chamber 62 between first and second air knives 28 and 34.

Expansion chamber 62 provides a significant cross-sectional volume for the gas exiting from first outlet 32 to exhaust into. Chamber 62 should have enough volume for the gas from first outlet 32 to exit the region under dual air knife assembly 20 easily under low differential pressure. The exiting air then passes parallel to dual air knife assembly 20 and exits at right angles to the pathway of circuit boards 40.

The height of expansion chamber 62 from any passing circuit board 40 is also important. Chamber 62 should be high enough to prevent any solder being blown off passing circuit board 40 from attaching to surface 64 of chamber 62 and subsequently dripping back down on to a passing circuit board 40. To further prevent any solder from sticking to surface 64 of chamber 62, the chamber may be coated with a non-stick material 66, such as an acid and flux resistant teflon.

Referring to FIG. 3, another embodiment of soldering system 52 is illustrated. In this particular embodiment, soldering system 52 includes a pair of flux stations 24, a pair of solder stations 26, and a pair of dual air knife assemblies 20 and 53. Conveyor 22 has been removed for ease of illustration. Corresponding elements in FIG. 3 have numeral designations which correspond to those numeral designations used in FIG. 2 and will not be described again here. Solder system in FIG. 3 is identical to the one disclosed in FIG. 2, except that flux stations 24, solder stations 26, and dual air knife assemblies 20 and 53 are disposed on both sides of circuit boards 40. As a result, solder system 52 in FIG. 3 is able to apply and remove excess solder and level any remaining solder on top and bottom surfaces 50 and 56 of circuit boards 40.

With soldering system 18 shown in FIG. 2, one or more circuit boards 40 are placed on or attached to the conveyor 22. Each circuit board 40 is moved to flux station 24 and coated with flux. Once the flux has been applied, the flux is heated to flow freely on circuit board 40 and to chemically treat the top surface 50 of circuit board 40 for the subsequent application of solder. Following flux station 24, circuit board 40 is brought to soldering station 26. Station 26 applies solder to board 40 which adheres to any exposed copper pads on board 40.

Following the application of the solder, circuit board 40 is brought to dual air knife assembly 20. Hot air from gas source 42 enters dual air knife assembly 20 at first inlet 30 and passes down through first passage 44 to first outlet 32 and also passes into port 60. Port 60 supplies the hot air from first passage 44 to second inlet 36 which then passes down second passage 46 to second outlet 38. First and second passages 44 and 46 become more narrow as they approach first and second outlets 32 and 38 to increase the pressure of the exiting hot air to about 2.9 psi. The hot air exits from first outlet 32 at an angle of about 90 degrees onto any passing circuit board 40 and the hot air from second outlet 38 passes out at an angle of about 40 degrees onto any passing circuit board 40. The hot air from first and second outlets 32 and 38 blasts against circuit boards 40 to remove excess solder to minimize the possibility of solder bridging or icicling upon solidification, to clear holes and to level the solder. The pressure of the hot air exiting from first and second outlets 32 and 38 should not be so great as to disturb adequately wetted solder connections.

Figure 1A:
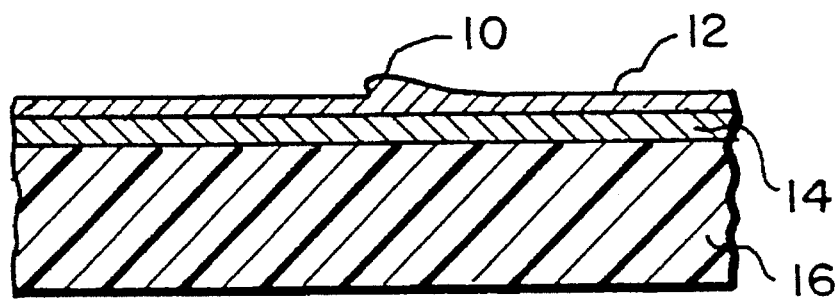
FIG. 1 (*a*) is a side cross sectional view of a circuit board which illustrates a solder wave.
Figure 1B:
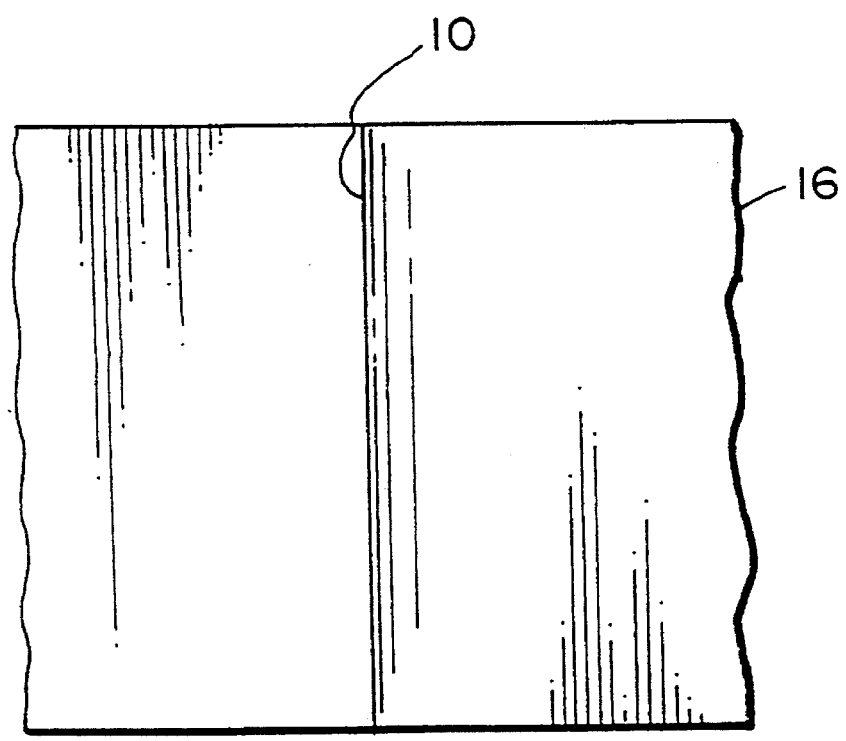

The hot air exiting from first and second outlets 32 and 38 is at a temperature, in this embodiment about 430 degrees fahrenheit, which has been selected to insure that the solder remains in a liquid state while under first and second outlets 32 and 38. With the solder in a liquid state, the hot air from first and second air knives 28 and 34 can remove excess solder and push forward any solder waves 10, such as the one shown in FIGS. 1 (a–b), to uniformly distribute and level the remaining solder on the pads. The use of second air knife 34 positioned closely following first air knife 28 and having substantially the same exiting air temperature and pressure and being substantially the same distance from passing circuit boards 40 substantially improves the removal of excess solder, reduces the deviations in solder thickness and mitigates the occurrence of the "double hung window effect."

The operation of soldering system 52 shown in FIG. 3 is identical to that described for FIG. 2, except that the process is performed on top and bottom surfaces 50 and 56 of any passing circuit board 40. Since the process for bottom surface 56 is identical to the one described above for top surface 50, the process will not be described here again.

To illustrate the effectiveness of dual air knife assembly 20 in solder system 18, a comparison of a hot air soldering levelling process with a single air knife and dual air knife assembly 20 was performed. A 60×60 mil. square copper pad was put into a solder system with a single air knife and another identical pad was placed in solder system 18 with dual air knife assembly 20. With single air knife assembly 20, a median solder thickness of 0.0030 inches with a standard deviation of +/–0.00025 inches on the circuit board was obtained. With dual air knife assembly 20, a median solder thickness of 0.00045 inches with a standard deviation of +/–0.00020 inches was obtained. As the results of this experiment show, dual air knife assembly 20 produces a distinct reduction in solder pad surface thickness deviation and thus a significant improvement in quality.

Having thus described the basic concept of the invention, it will be readily apparent to those skilled in the art that the foregoing disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the present invention. Accordingly, the invention is limited only by the following claims and equivalents thereto.

What is claimed is:

1. A dual air knife assembly for removing excess solder and leveling any remaining solder on a circuit board with a gas from a gas source comprises:

a first air knife having a first passage with a first inlet adapted to connect to the gas source and a first outlet adapted to be positioned adjacent to one side of the circuit board; and a second air knife having a second passage with a second inlet connected to the gas source and a second outlet adapted to be positioned adjacent to the same side of the circuit board as said first air knife, wherein at least one of said first or second air knives is positioned to be substantially perpendicular to the circuit board.

2. The dual air knife assembly according to claim 1 wherein said first air knife is positioned to be substantially perpendicular to the circuit board and said second air knife is positioned to be at an angle less than 90 degrees to the circuit board.

3. The dual air knife assembly according to claim 2 wherein said second air knife is positioned to be at an angle between 20 and 60 degrees to the circuit board.

4. The dual air knife assembly according to claim 1 further comprising:

a spacer with a port extending through said spacer, said spacer positioned between said first air knife and said second air knife, said port connecting said second inlet to said second passage to said first passage.

5. The dual air knife assembly according to claim 4 wherein said spacer is recessed from the one side of the circuit board to create a chamber between said first and second air knives.

6. The dual air knife assembly according to claim 5 wherein the chamber in said spacer is coated with a non-stick material.

7. The dual air knife assembly according to claim 1 wherein said first air knife and said second air knife are surrounded by an insulating material.

8. The dual air knife assembly according to claim 1 wherein said first outlet from said first air knife and said second outlet from said second air knife are spaced substantially the same distance from the one side of the circuit board.

9. The dual air knife assembly according to claim 8 wherein said distance is between 40 and 70 mils.

10. The dual air knife assembly according to claim 1 wherein the temperature of the hot air exiting from said first air knife and said second air knife is substantially the same.

11. The dual air knife assembly according to claim 10 wherein the temperature is between 400 and 450 degrees fahrenheit.

12. The dual air knife assembly according to claim 1 wherein the pressure of the air exiting said first outlet from said first air knife and said second outlet from said second air knife is substantially the same.

13. The dual air knife assembly according to claim 12 wherein the pressure is between 2 psi. and 3.5 psi.

14. The dual air knife assembly according to claim 1 wherein said first outlet of said first air knife is spaced from said second outlet of said second air knife between 0.5 and 2.5 inches apart.

15. A solder system for applying solder to a circuit board comprising:
   a conveyor for transporting the circuit board through the solder system;
   a flux station for applying flux to the circuit board;
   a solder station for applying solder to the circuit board; and
   a dual air knife assembly for removing excess solder and levelling any remaining solder on the circuit board with a gas from a gas source, said assembly comprising at least two air knives, each said air knife having a passage with an inlet and an outlet, with said inlets connected to the gas source and with the outlets of said air knives positioned adjacent to one side of the circuit board on said conveyor, wherein at least one of said air knives is positioned to be substantially perpendicular to the circuit board.

16. The solder system according to claim 15 further wherein said assembly further comprises:
   a spacer with a port extending through said spacer, said spacer positioned between said air knives, said port connecting said inlet of one said air knife to said passage of the other said air knife.

17. The solder system according to claim 16 wherein said spacer is recessed from the circuit board on said conveyor to create a chamber between said outlets of said air knives.

18. The solder system according to claim 17 wherein the chamber in said spacer is coated with a non-stick material.

19. The solder system according to claim 15 wherein one of said air knives is positioned to be substantially perpendicular to the circuit board on said conveyor and the other of said air knives is positioned to be at an angle less than 90 degrees to the circuit board on said conveyor.

20. The solder system according to claim 19 wherein the other of said air knives is positioned to be at an angle between 20 to 60 degrees to the circuit board on said conveyor.

21. The solder system according to claim 15 wherein said outlets are spaced substantially the same distance from the circuit board on said conveyor.

22. The solder system according to claim 15 wherein the gas exiting from said outlets is at substantially the same pressure.

23. The solder system according to claim 15 wherein the gas from said outlets is at substantially the same temperature.

24. The solder system according to claim 15 further comprising a second dual air knife assembly positioned on an opposing side of said conveyor from said first dual air knife assembly.

25. A method of removing excess solder and leveling any remaining solder on a circuit board with a first air knife having a first passage with a first inlet adapted to connect to a gas source and a first outlet adapted to be positioned adjacent to one side of the circuit board and a second air knife having a second passage with a second inlet connected to the gas source and a second outlet adapted to be positioned adjacent to the same side of the circuit board as said first air knife, said method comprising the steps of:
   blowing off excess solder from one side of the circuit board with gas from the first outlet; and
   levelling any remaining solder with gas from the second outlet on the same side of the circuit board as said first outlet, wherein the gas from at least said first or second outlet exits in a direction substantially perpendicular to the circuit board.

26. The method according to claim 25 further comprising a third air knife having a third passage with a third inlet adapted to connect to a gas source and a third outlet adapted to be positioned adjacent to the other side of the circuit board and a fourth air knife having a fourth passage with a fourth inlet connected to the gas source and a fourth outlet adapted to be positioned adjacent to the same side of the circuit board as said third air knife, said method further comprising the steps of:
   blowing off excess solder from the other side of the circuit board with gas from the third outlet; and
   levelling any remaining solder with gas from the fourth outlet on the same side of the circuit board as said third outlet.

27. A method for applying solder to a circuit board in a solder system comprising:
   transporting the circuit board with a conveyor through the solder system;
   applying flux to the circuit board with a flux station;
   applying solder to the circuit board at a solder station; and
   removing any excess solder and levelling any remaining solder on the circuit board with a gas from a gas source, said air knife comprising at least two air knives each said air knife having a passage with an inlet and an outlet, with said inlets connected to the gas source and with the outlets of said air knives positioned adjacent to one side of the circuit board on said conveyor, the gas from one of the air knives exiting in a direction substantially perpendicular to the circuit board.

28. The method according to claim 27 wherein said outlets are spaced substantially the same distance from the circuit board on said conveyor.

29. The method according to claim 27 wherein the gas exiting from said outlets is at substantially the same the same pressure.

30. The solder system according to claim 27 wherein the gas exiting from said outlets is at substantially the same the same temperature.

31. The dual air knife assembly according to claim 1 further comprising a third air knife having a third passage with a third inlet adapted to connect to a second gas source and a third outlet adapted to be positioned adjacent to the other side of the circuit board from the first and second air knives and a fourth air knife having a fourth passage with a fourth inlet connected to the second gas source and a fourth outlet adapted to be positioned adjacent to the same side of the circuit board as the third air knife.

* * * * *